United States Patent [19]
Sato

[11] Patent Number: 5,999,457
[45] Date of Patent: Dec. 7, 1999

[54] SEMICONDUCTOR INTEGRATED CIRCUIT

[75] Inventor: Katsuhiko Sato, Yokohama, Japan

[73] Assignee: Kabushiki Kaisha Toshiba, Kanagawa-ken, Japan

[21] Appl. No.: 09/183,646

[22] Filed: Oct. 30, 1998

[30] Foreign Application Priority Data

Oct. 31, 1997 [JP] Japan ................................. 9-300615

[51] Int. Cl.$^6$ .............................. G11C 16/04; G11C 8/00
[52] U.S. Cl. ................................. 365/189.01; 365/189.05; 365/230.08
[58] Field of Search ........................ 365/189.01, 189.02, 365/189.05, 189.08, 230.02, 230.06, 230.08

[56] References Cited

U.S. PATENT DOCUMENTS 4,855,958  8/1989  Ikeda .................................. 365/230.08
5,698,876  12/1997  Yabe et al. ............................ 257/296
5,854,763  12/1998  Gillingham et al. ............... 365/189.01

OTHER PUBLICATIONS

Yabe, et al., "A Configurable DRAM Macro Design for 2112 Derivative Organizations to be Synthesized Using a Memory Generator," 1998 IEEE International Solid–State Circuits Conference, pp. 72–73.

*Primary Examiner*—Trong Phan
*Attorney, Agent, or Firm*—Loeb & Loeb, LLP

[57] ABSTRACT

A semiconductor integrated circuit incorporating DRAM 2 and a logic circuit 3 includes a vector generating circuit 40 formed on the common substrate. Upon a burn-in process, the vector generating circuit 40 and a refresh counter and control circuit 23 are activated to generate addresses, commands and data required for activating DRAM 2. In this manner, DRAM 2 and the logic circuit 3 can be activated independently, simultaneously, and the time required for the burn-in process can be reduced.

19 Claims, 14 Drawing Sheets

SEMICONDUCTOR INTEGRATED CIRCUIT

BACKGROUND OF THE INVENTION

1. Field of the Invention

This invention relates to a method and a circuit for applying vectors to a storage device, and more particularly, to those used in a burn-in process of a semiconductor integrated circuit incorporating a large-scaled storage device and a logic circuit.

2. Description of the Prior Art

Conventionally, a burn-in process was conducted for semiconductor integrated circuits to ensure a certain quality by removing defective products. The term "burn-in" pertains to a process of activating semiconductor integrated circuits under a high temperature condition for a predetermined time, e.g. ten hours, in order to apply a stress to the semiconductor integrated circuits and find out any which malfunctions in the initial operation.

FIG. 12 shows a schematic view of a conventional semiconductor integrated circuit, that is, it includes DRAM 2 which is a dynamic memory device. The semiconductor integrated circuit 1 incorporated DRAM 2 and a logic circuit 3. DRAM 2 includes an input circuit 21 at its input end and an output circuit 22 at its output end. The logic circuit 3 includes multiplexers 31 and 32 located upstream of the input of the input circuit. Similarly, the logic circuit 3 includes multiplexers 33 and 34 located downstream of the output circuit 22. These multiplexers 31, 32, 33 and 34 are supplied with a mode selection signal TM from the exterior. The mode selection signal TM is a signal for changing the semiconductor integrated circuit 1 to a DRAM test mode or a normal mode. The multiplexers 31 and 32 are configured to be switched by the mode selection signal TM to selectively output an input from external signals IN1 through INn or an input from the logic circuit to the input circuit 21. Similarly, the multiplexers 33 and 34 are configured to be switched by the mode selection signal TM to selectively output to output terminal OUT1 through OUTn or the logic circuit 3. That is, the multiplexers 31, 32, 33 and 34 enable direct access to DRAM 2 from the exterior when DRAM 2 is tested.

When the mode selection signal TM indicates the DRAM test mode, the external signals IN1 through INn are transferred to the input circuit 21 of DRAM 2, and an output signal from the output circuit 22 of DRAM 2 is released from external terminals OUT1 through OUTn. When the mode selection signal TM indicates the normal mode, a signal from the logic circuit 3 is transferred to the input circuit 21 of DRAM 2, and the output from the output circuit 22 of DRAM 2 is treated in the logic circuit 3.

FIG. 13 is a block diagram showing the interior structure of DRAM 2 referred to above. As shown in FIG. 13, the input circuit 21 is supplied with a load address signal RA0-i, column address signal CA0-k, segment address signal SA0-j, write data signal D0-n, clock signal CLK, read-out signal RD, write signal WT, and refresh signal REF. These signals are details of the external signals IN1 through INn. Output from the output circuit 22 are read-out data signals Q0 through Qn. These signals are details of the output signals OUT1 through OUTn. DRAM 2 has a refresh counter and control circuit 23, segment address decoder 24 and control circuit 25.

DRAM 2 also has a plurality of segments SG1 through SG4 each including a column decoder 26, memory array 27 and a row decoder 28. The column decoder 26 is supplied with a complementary signal which is shaped in waveform from the column address signal CA0-k, and a control signal from the segment address decoder 24. The segment address decoder 24 is supplied with the segment address signal SA0-j. The memory array 27 includes a plurality of memory cells in a matrix alignment. The row decoder 28 is supplied with a signal from the segment address decoder 24 and a complementary signal from the refresh counter and control circuit 23. The complementary signal from the refresh counter and control circuit 23 is the complementary signal of the row address RA0-i input into the refresh counter and control circuit.

A first sense amplifier S/A peculiar to DRAM is contained in the memory array 27. Further provided is a data IN/OUT circuit 29 for executing write and read in these segments SG1 through SG4. The data IN/OUT circuit 29 is supplied with a signal made by waveform-shaping the write data signal D0-n in the input circuit 21, and a control signal from the control circuit 25 which is supplied with the read-out signal RD and the write signal WT.

With reference to FIG. 13, behaviors of the semiconductor integrated circuit are briefly explained.

For writing, the row address signal RA0-i, segment address signal SA0-j and column address signal CA0-k are input to the input circuit 21. These signals determine one of the memory arrays 27. When the read-out signal RD is selected in this status, data is transferred from the memory cell to the data IN/OUT circuit 29. Then, it is transferred to the output circuit 22 and released therefrom as the output signal Q0-n.

In this manner, for write and read operation, a single segment is selected. In contrast, under the condition with the refresh signal REF supplied, the segment address decoder 24 receives the refresh signal REF, and results in all of the segments SG1 through SG4 being selected. Selection of a row address relies on the signal from the refresh counter and control circuit 23.

It will be understood also from FIG. 12 that, in most cases, terminals necessary for the substantial operation of the logic circuit 3 are commonly used as the input terminals IN1 through INn and output terminals OUT1 through OUTn, in order to diminish the number of pins in the entirety of a single semiconductor integrated circuit and to permit direct access to DRAM 2 even after assembly. Therefore, for access to DRAM 2, one of normal operation or test operation must be selected. That is, for read and write operation of DRAM 2, it must be selected through the logic circuit 3 whether DRAM 2 should be operated normally or for a test.

For a burn-in process of the semiconductor integrated circuit 1 of this type, different vectors are supplied to DRAM 2 and the logic circuit 3, independently, or a vector for the logic circuit 3 is used for read and write of all memory cells. However, the former process of applying different vectors are applied independently to DRAM 2 and the logic circuit 3 requires a longer burn-in time to conduct it independently for DRAM 2 and the logic circuit 3. The latter process of accessing to all memory cells by using a vector for the logic circuit 3 is actually impossible because of problems in vector length of a burn-in device. The term "vector" herein means signals such as address, data and instruction which are necessary for activating DRAM 2 and the logic circuit 3.

SUMMARY OF THE INVENTION

It is therefore an object of the invention to provide a semiconductor integrated circuit capable of reducing the burn-in time. That is, it is intended to provide a semiconductor integrated circuit to which different vectors can be simultaneously used individually for DRAM 2 and the logic circuit 3 to apply appropriate stresses to them during a burn-in process. It is also intended to provide a semiconductor integrated circuit satisfying the requirement without increasing the number of pins.

According to the invention, there is provided a semiconductor integrated circuit comprising:

a memory macro having at least one memory array having an arbitrary capacitance, a decoder circuit for selecting one of a plurality of memory cells in the memory array, and a sense amplifier for amplifying data from said memory cell;

an address generating circuit for generating an address specifying each memory cell;

a command generating circuit for generating a write or read command for the memory cell; and a data generating circuit for generating data to be written in the memory cell.

There is further provided a semiconductor integrated circuit comprising:

a memory macro having at least one memory array having an arbitrary capacitance, a decoder circuit for selecting one of a plurality of memory cells in the memory array, and a sense amplifier for amplifying data from said memory cells;

an address generating circuit for generating an address specifying each memory cell;

a command generating circuit for generating a write or read command for the memory cell; and a data generating circuit for generating data to be written in said memory cell, wherein said address generating circuit includes:

a row address generating circuit for generating a row address;

a column address generating circuit for generating a column address; and a segment address generating circuit for generating a segment address.

There is further provided a semiconductor integrated circuit incorporating memory and a logic circuit, comprising:

a mode switching circuit for switching a normal mode for normally accessing to the memory and a test mode for executing an operation test of the memory therebetween; and an operation signal generating circuit activated in the test mode to generate a signal necessary for activating the memory and to activate the memory simultaneously with operation by an input from outside of the logic circuit.

DETAILED DESCRIPTION OF THE PREFERRED EMBODIMENTS

The embodiment shown here is a semiconductor integrated circuit incorporating a large-scale storage device and a logic circuit, in which a vector generating circuit for generating desired vectors for a storage device is provided on the semiconductor integrated circuit so that a burn-in process can be conducted efficiently by blocking input signals from the logic circuit to the storage device while the vector generator circuit is driven. Details thereof are explained below with reference to the drawings.

Figure 1:
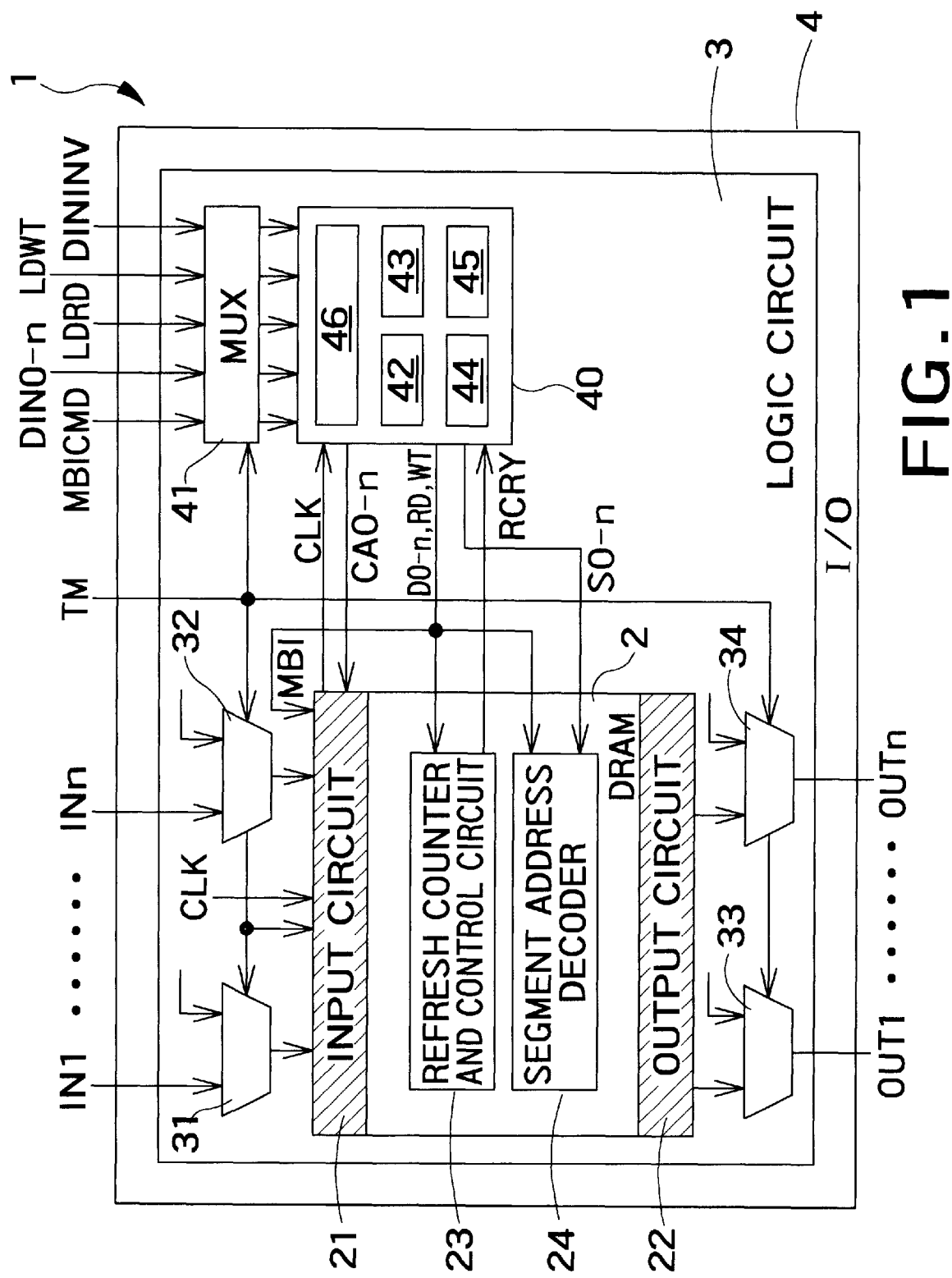
FIG. 1 is a block diagram of a semiconductor integrated circuit according to an embodiment of the invention.

FIG. 1 is a diagram schematically showing the semiconductor integrated circuit according to the invention. As shown in FIG. 1, the semiconductor integrated circuit 1 includes DRAM 2 and a logic circuit 3. DRAM 2 has an input circuit 21 in its input side, and an output circuit 22 in its output side. DRAM 2 further includes a refresh counter and control circuit (operation signal generating circuit) 23 and a segment address decoder 24. The refresh counter and control circuit 23 is used for self-refresh function required in memory cells. The refresh counter and control circuit 23 has an address counter for selection of a word line.

The logic circuit 3 includes multiplexers 31, 32, 33 and 34. Multiplexers 31 and 32 are located upstream of the input side of the input circuit 21 of DRAM 2. These multiplexers 31 and 32 are supplied with input signals through input terminal IN1 to INn and a signal from the logic circuit. Multiplexers 33 and 34 are located downstream of the output side of the output circuit 22 of DRAM 2. These multiplexers 33 and 34 are supplied with an output signal from DRAM 2 and a signal from the logic circuit 3. These multiplexers 31, 32, 33 and 34 are supplied with a mode selection signal TM. The mode selection signal TM determines which of the DRAM test mode or the normal mode should be selected. When the mode selection signal TM indicates the DRAM test mode, the multiplexers 31 and 32 block the signal from the logic circuit 3 to DRAM 2.

With reference to a right upper portion of FIG. 1, the semiconductor integrated circuit 1 includes the vector generating circuit (operation signal generating circuit) 40 and a multiplexer 41.

The multiplexer 41 receives a vector create control signal MBICMD, write data initial value DIN, data invert control signal DININV, read-out signal LDRD, and write signal LDWT from the exterior of the semiconductor integrated circuit 1. Among these signals, the write data initial value DIN is a signal for setting the initial value of write data. The data invert control signal DININV, read-out signal LDRD and write signal LDWT are signals for previously entering a read/write command to a function command generating circuit 45 provided in the vector generating circuit 40 as explained later. The multiplexer 41 is also supplied with the mode selection signal TM.

The vector generating circuit 40 and the refresh counter and control circuit 23 generate signals necessary for specifying an address in DRAM 2. More specifically, the refresh counter and control circuit 23 generates a row address of DRAM 2 whereas the vector generating circuit 40 generates a column address and a segment address of DRAM 2. The vector generating circuit 40 includes a column address generating circuit 42, segment address generating circuit 43, write data generating circuit 44, function command generating circuit 45 and address create control circuit 46. The vector generating circuit 40 is supplied with the vector generating control signal MBICMD, write data initial value DIN, data invert control signal DININV, read-out signal LDRD and write signal LDWT, which are referred to above, through the multiplexer 41. The vector generating circuit 40 is also supplied with a carry signal RCRY from the refresh counter and control circuit 3 in DRAM 2, and a clock signal CLK from DRAM 2. The clock signal CLK is similar to an external clock signal CLK supplied from the logic circuit 3 to DRAM 2.

In contrast, DRAM 2 is supplied with column address signals CAO through CAn, write data signals D0 through Dn, read-out signal RD, write signal WT and vector create start signal MBI from the vector generating circuit 40. Among these signals, column address signals CA0 to CAn, write data signals D0 to Dn, read-out signal RD and write signal WT are introduced into the input circuit 21. The segment address signals S0 to Sn are introduced directly into the segment address decoder 24. The vector create start signal MBI is introduced to the input circuit 21, refresh counter and control circuit 23 and segment address decoder 24. The vector create start signal MBI is a signal indicating the generation of a vector being started in the vector generating circuit 40, and it is generated in the vector generating circuit 40. In response to the vector create start signal MBI, the refresh counter and control circuit 23 operates in a mode different from the normal mode, the segment decoder 24 switches the input signal, and also the input circuit 21 switches the input signal.

In the semiconductor integrated circuit 1 shown in FIG. 1, the signals supplied from the exterior are introduced via the multiplexer 41 because they are common to signals required for the substantial operation of the logic circuit 3. However, these signals may be introduced directly from an I/O circuit 4 on the semiconductor integrated circuit 1.

Figure 2:
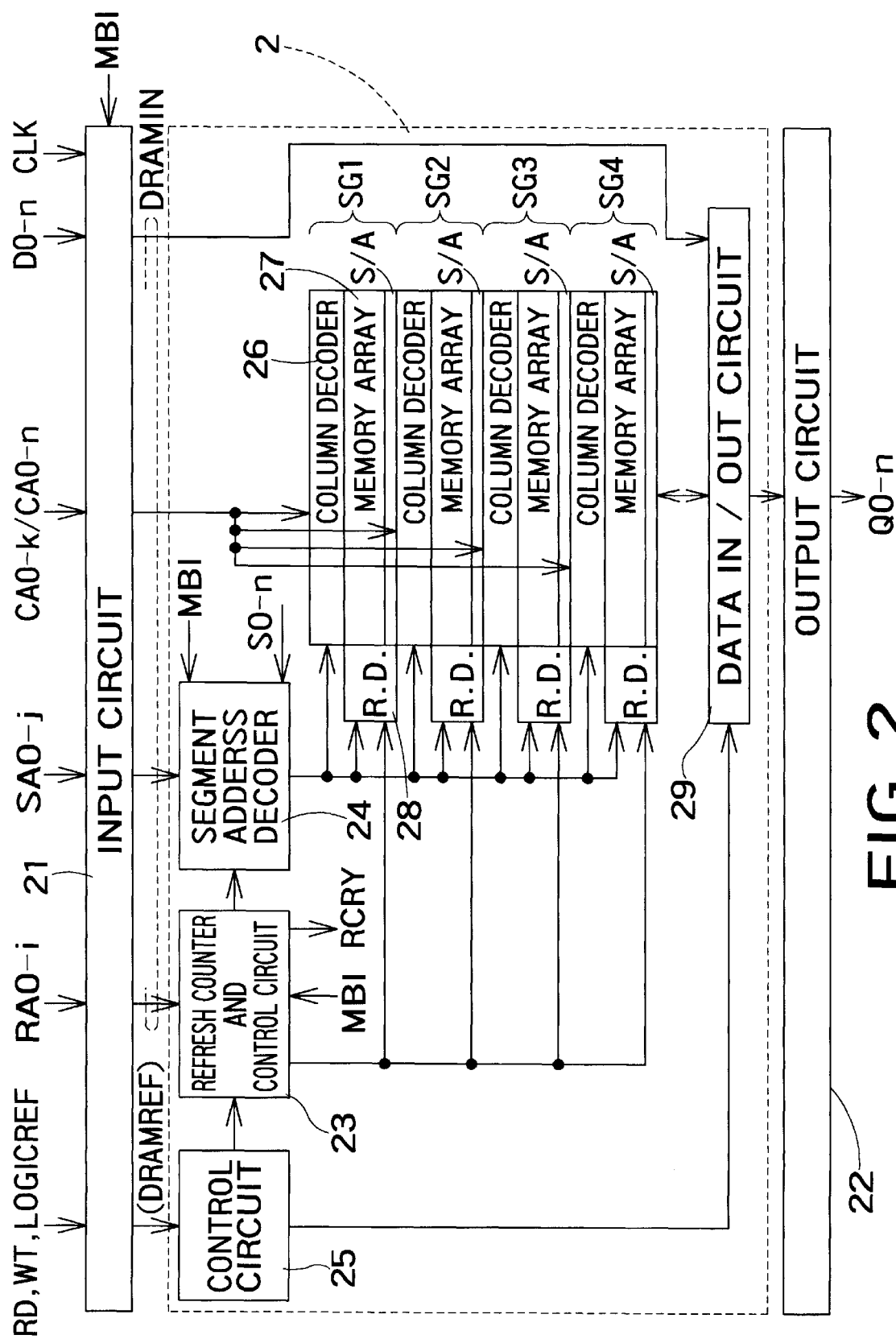
FIG. 2 is a block diagram showing the interior construction of DRAM 1 shown in FIG. 1.

FIG. 2 is a block diagram showing the interior construction of DRAM 2. As shown in FIG. 2, the input circuit 21 is supplied with a row address signal RA0-i, column address signal CA0-k, segment address signal SA0-j, write data signal D0-n, clock signal CLK, read-out signal RD, write signal WT and refresh signal LOGICREF. These signals are details of the external signals IN1 through INn in FIG. 1. Released from the output circuit 22 are data signal Q0 to Qn. These signals are details of the output signals OUT1 to OUTn in FIG. 1. DRAM 2 contains therein a refresh counter and control circuit 23, segment address decoder 24, and control circuit 25.

Further, DRAM 2 includes a plurality of segments SG1 to SG4 each having a column decoder 26, memory array 27 and row decoder 28. The column decoder 26 is supplied with a complementary signal waveform-shaped from the externally supplied column address signal CA0-k or a column address signal CA0-n from the vector generating circuit 40. The column decoder 26 is further supplied with a control signal from the segment address decoder 24. The segment address decoder 24 is supplied with an externally supplied segment address signal SA0-j and a segment address signal SA-n from the vector generating circuit 40.

The memory array 27 includes a plurality of memory cells in a matrix alignment. The row decoder 28 is supplied with a signal from the segment address decoder 24 and a complementary signal from the refresh counter and control circuit 23. In response to the signal from the segment address decoder 24, one of these segments SG1 to SG4 is selected. Which segment be selected from four segments SG1 to SG4 is determined by the segment address signal SA0-1 introduced from outside to the segment address decoder 24 or the segment address signal S0-n introduced from the vector generating circuit 40 to the segment address decoder 24. Which one of these segment address signals SA0-j and S0-n be selected by the segment address decoder 24 is switched by the vector create start signal MBI. Generated from the refresh counter and control circuit 23 is the row address. The refresh counter and control circuit 23 is supplied with a row address signal RA0-i from outside. For normal write and read operation, the refresh counter and control circuit 23 specifies a row address from the externally supplies row address signal RA0-i. For refresh or test operation, the refresh counter and control circuit 23 generates a row address therein.

A first sense amplifier S/A peculiar to DRAM is contained in the memory array 27. Further provided is a data IN/OUT circuit 29 for executing write and read operation in these segments SG1 through SG4. The data IN/OUT circuit 29 is supplied with the write data signal D0-n waveform-shaped in the input circuit 21, and a control signal from the control circuit 25 which is supplied with the read-out signal RD and the write signal WT.

Figure 3:
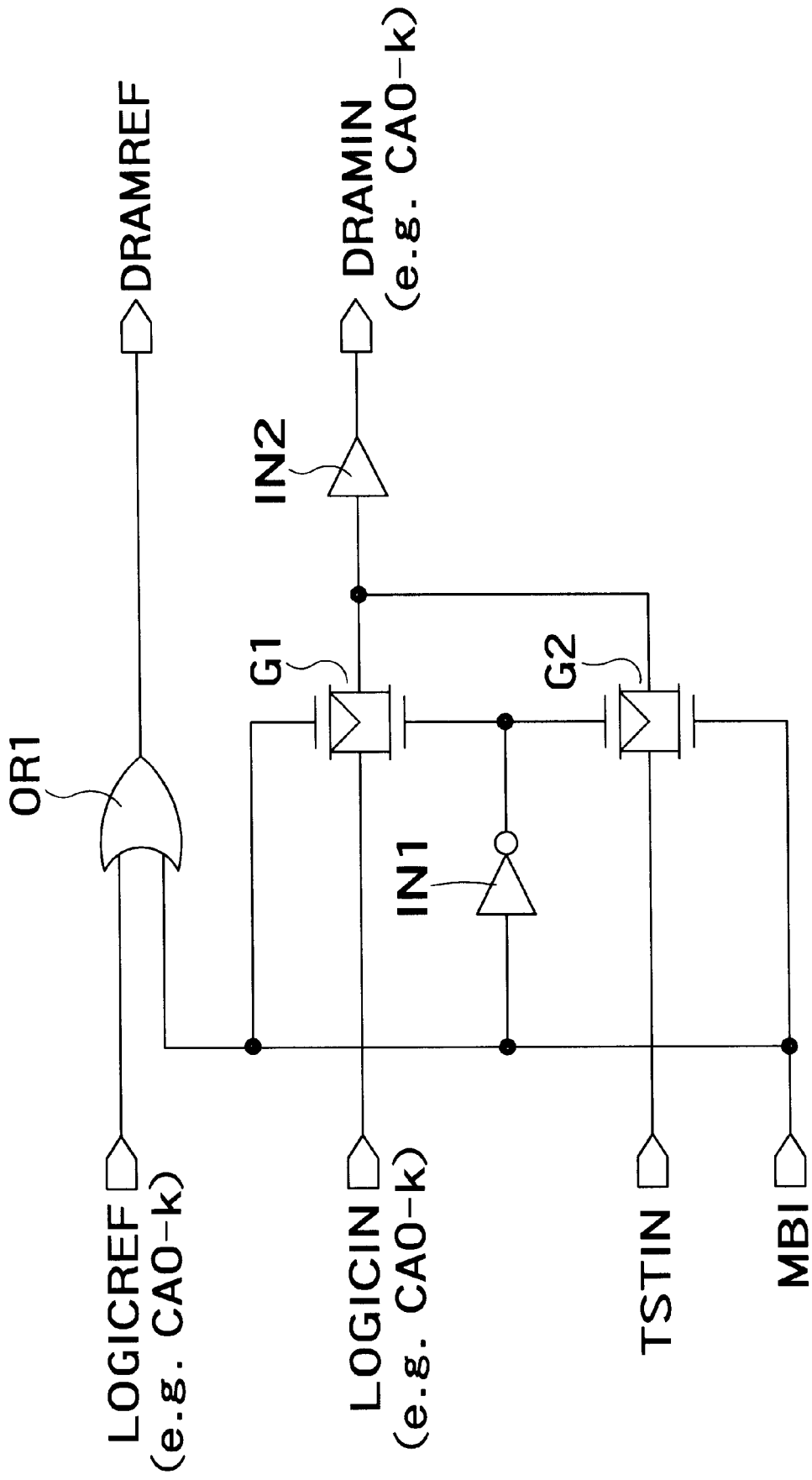
FIG. 3 is a diagram showing a circuit arrangement of an input circuit shown in FIG. 1.

FIG. 3 is a diagram showing a circuit arrangement of the input circuit 21. As shown there, the input circuit 21 includes an OR circuit OR1, gate circuits G1, G2, inverters IN1 and IN2. The OR circuit OR1 introduces a refresh signal LOGICREF and the vector create start signal MBI from the logic circuit 3, and releases therefrom a DRAM refresh signal DRAMREF to the control circuit 25 (see FIG. 2). The gate circuit G1 introduces a signal LOGICIN from the logic circuit 3, and the gate circuit G2 introduces a signal TSTIN from the vector generating circuit 40. The signal LOGICIN is a general term of signals from the logic circuit 3, and the column address signal CA0-k corresponds to it. The signal TSTIN is a general term of signals from the vector generating circuit 40, and the column address signal CA0-n corresponds to it. These gate circuits G1 and G2 also introduce the vector create start signal MBI, and one of them alternately is configured to introduce signals. That is, the vector create start signal MBI is introduced into one of control electrodes of the gate circuits G1, G2 whereas a signal inverted from the vector create start signal MBI is introduced into the other control electrodes of the gate circuits G1, G2. A signal from the gate circuits G1, G2 is input to the inverter IN2. The inverter IN2 releases the signal DRAMIN input to DRAM 2. The signal DRAMIN is a general term of signals input to DRAM 2, and it is one of the column address signal CA0-k and column address signal CA0-n in the example shown above.

It will be understood from FIG. 3 that the input circuit 21 switches the signal LOGICIN from the logic circuit 3 and the signal TSTIN from the vector generating circuit 40 in response to the vector create start signal MBI. Moreover, in response to the vector create start signal MBI, it effectuates the DRAM refresh signal DRAMREF, which is a compulsory refresh command, in order to change DRAM 2 to the refresh mode.

Although FIG. 3 shows the refresh signal LOGICREF and the vector create start signal MBI as being introduced to the OR circuit OR1, the circuit need not be an OR circuit provided an equivalent behavior is promised.

Figure 4:
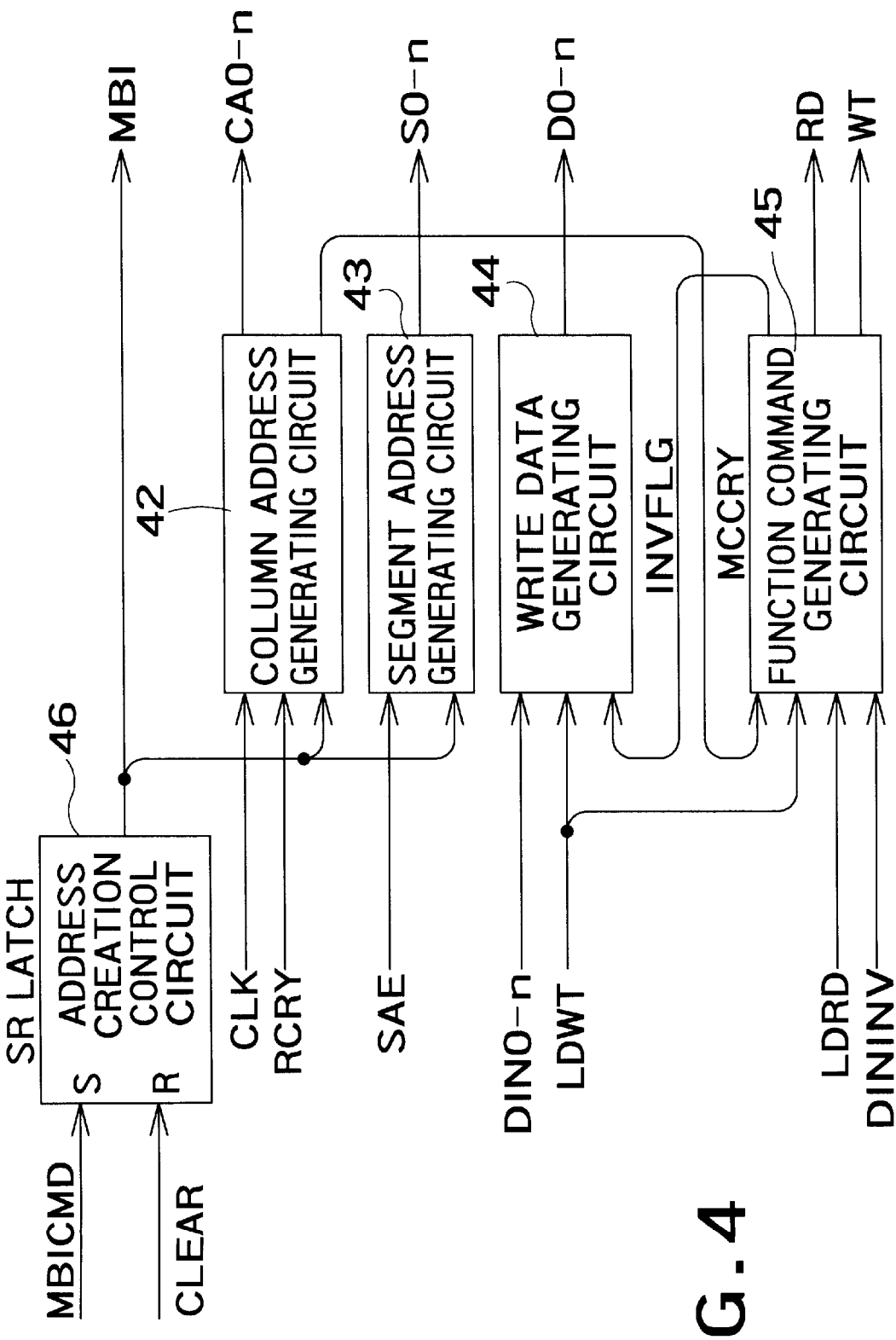
FIG. 4 is a block diagram of a vector generating circuit.

FIG. 4 is a block diagram of the vector generating circuit 40. As shown in FIG. 4, the vector generating circuit 40 includes a column address generating circuit 42, segment address generating circuit 43, write data generating circuit 44, function command generating circuit 45 and address create control circuit 46.

The column address generating circuit 42 introduces a carry signal RCRY which is a signal released from the refresh counter and control circuit 23 as a result of increment (borrow signal when released as a result of decrement), clock signal CLK supplied from DRAM 2 and vector create start signal MBI. The column address generating circuit 42 supplies a column address signal CA0-n to the input circuit 21 of DRAM 2. That is, the column address generating circuit 42 is configured to count up one column address after one cycle of row addresses in the refresh counter and control circuit 23. The column address generating circuit 42 also supplies a carry signal MCCRY to the function command generating circuit 45.

The segment address generating circuit 43 introduces a sense amplifier drive signal SAE from DRAM 2 and the vector create start signal MBI. The segment address generating circuit 43 supplies a segment address signal S0-n to the segment address decoder 24 of DRAM 2. The segment address generating circuit 43 is configured and used to generate a signal for selecting all segments SG1 to SG4 in DRAM 2 in one cycle of the external clock signal CLK.

Figure 4A:
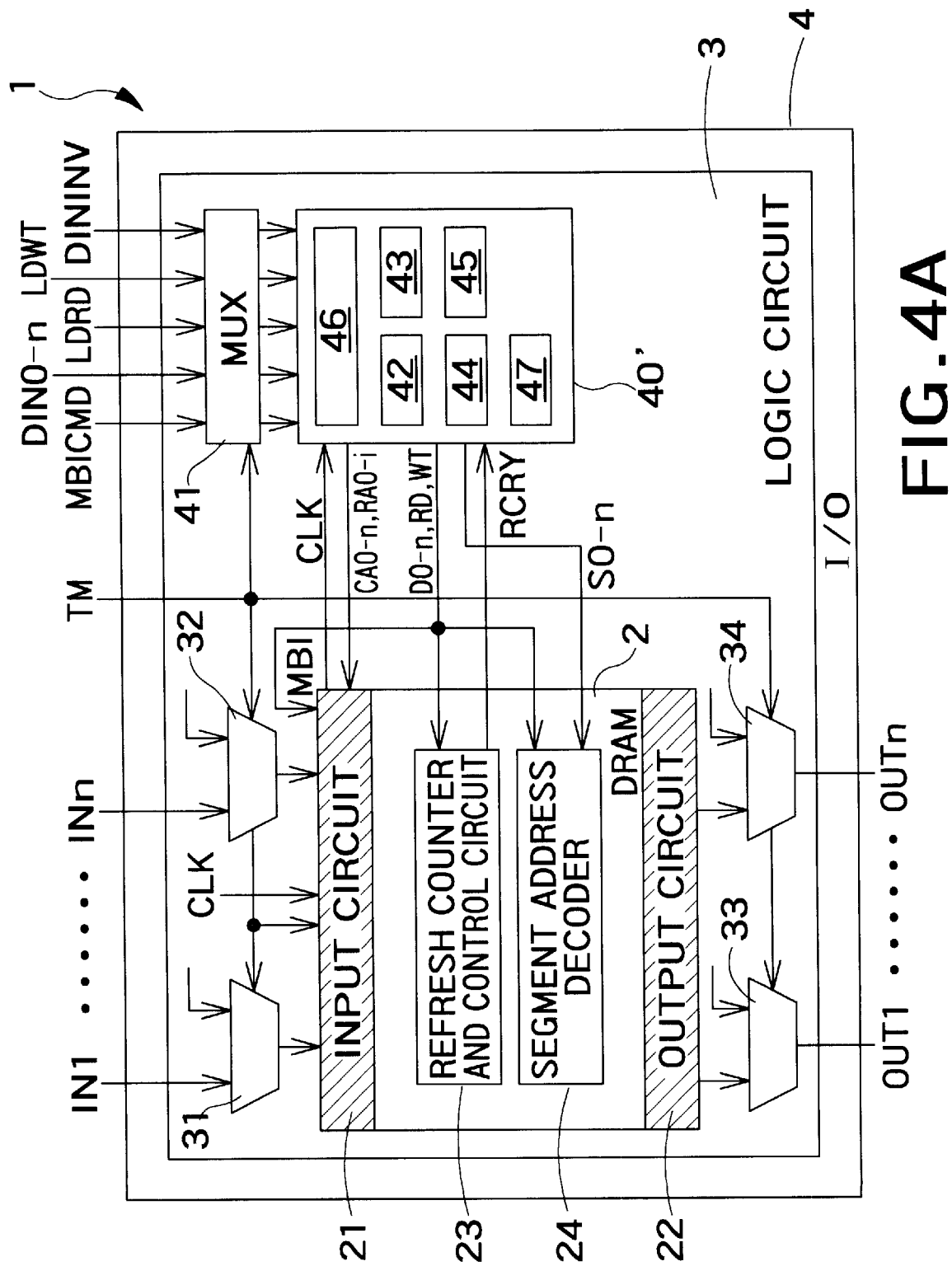
FIG. 4A is a block diagram of a semiconductor integrated circuit according to another embodiment of the invention.

The column address generating circuit 42, segment address generating circuit 43 and the refresh counter and control circuit 23 in DRAM 2, explained before, form an address generating circuit for generating signals necessary for specifying an address in DRAM 2. That is, among these addresses, the row address is generated in the refresh counter and control circuit 23. By making use of the row address can be made in the refresh counter and control circuit 23, components of the vector generating circuit can be reduced. In this case, however, it is also possible to independently provide a row address generating circuit 47 in the vector generating circuit 40' as shown in FIG. 4A so that the vector generating circuit 40' generates all necessary signal for specifying an address in DRAM 2. It results in supplying also the row address RA0-i generated in the vector generating circuit 40 to DRAM 2. Alternatively, it may be configured so that the column address generating circuit 42 sequentially increments the column address and, after one cycle of column addresses, the refresh counter and control circuit 23 increments the row address.

The write data generating circuit 44 introduces a write data initial value DIN0-n which is an initial value of write data from the logic circuit 3, write signal LDWT, and data invert control signal INVFLG from the function command generating circuit45. The write data generating circuit 44 supplies a write data signal D0-n to the input circuit 21 of DRAM 2.

The function command generating circuit 45 introduces a carry signal MCCRY from the column address generating circuit 42, read signal LDRD from the logic circuit 3 and data invert control signal DININV. The function command generating circuit 45 supplies a read signal RD and a write signal WT to the input circuit 21 of DRAM 2. That is, the function command generating circuit 45 behaves to generate a new instruction when access to all addresses in DRAM 2 is completed.

The address create control circuit 46 introduces a vector create control signal MBICMD from the logic circuit 3 and a clear signal CLEAR. The address create control circuit 46 used in the embodiment is a set/reset latch circuit. That is, the vector create control signal MBICMD is input to its S terminal, and the clear signal CLEAR is input to the R terminal. The latch circuit is typically configured to output level "1" when it is set and to output level "0" when it is reset. In the embodiment shown here, it is designed to be set when the vector create control signal MBICMD is level "1" and to be reset when the clear signal CLEAR is level "1". Therefore, the address create control circuit 46 not only functions to hold the vector create control signal MBICMD and release it as the vector create start signal MBI but also functions to clear the vector create start signal MBI when the clear signal CLEAR enters. As explained above, the vector create start signal MBI is supplied to the column address generating circuit 42 and the segment address generating circuit 43. That is, the vector generating circuit 40 is controlled to start or stop its behavior by the vector create start signal MBI output from the address generating circuit 46. The vector create start signal MBI is supplied also to DRAM 2 as explained above. Therefore, in receipt of the vector create start signal MBI, the input circuit 21 of DRAM 2 selects the input signal from the logic circuit 3 and the input signal from the vector generating circuit 40. That is, when the vector create start signal MBI indicates generation of a vector, the input circuit 21 supplies the input signal from the vector generating circuit to DRAM 2 and invalidates the input signal from the logic circuit.

Next referring to FIGS. 5 through 8, exemplary circuit arrangements of the column address generating circuit 42, segment address generating circuit 43, write data generating circuit 44 and function command generating circuit 45 are explained.

Figure 5:
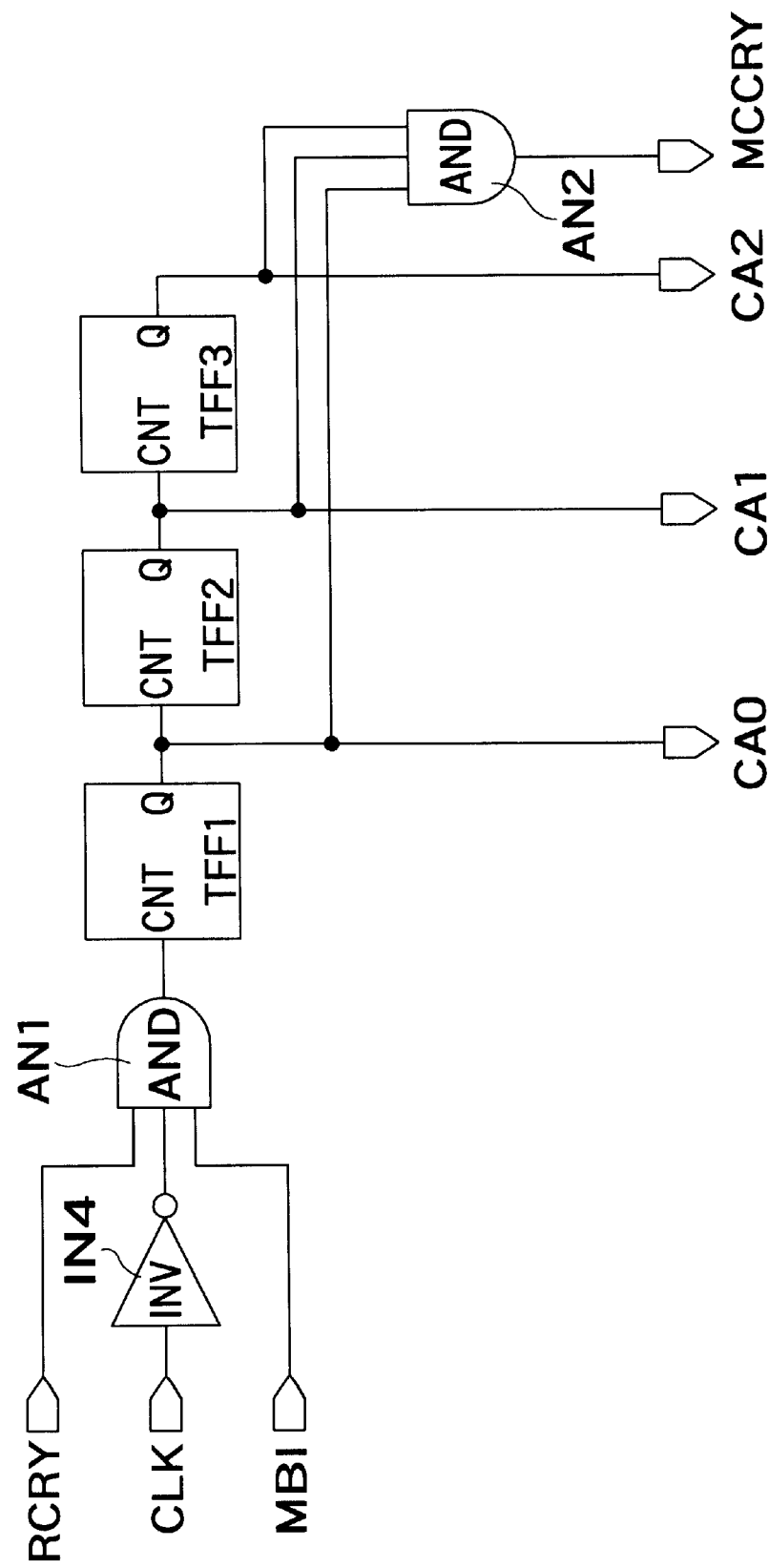
FIG. 5 is a diagram showing a circuit arrangement of a column address generating circuit.

FIG. 5 shows a circuit arrangement of the column address generating circuit 42 of the vector generating circuit 40. As shown in FIG. 5, the column address generating circuit 42 includes an inverter IN4, AND gate AN1, toggle-type flip-flops TFF1 to TFF3, and AND gate AN2. The AND gate AN1 introduces an inverted signal of the clock signal CLK supplied from the logic circuit 3, vector create start signal MBI and carry signal RCRY from the refresh counter and control circuit 23, and it releases a count signal to activate the column counter made up of the toggle-type flip-flops TFF1 to TFF3. Responsively, the toggle-type flip-flops TFF1 to TFF3 count up every time when the carry signal RCRY is output. When all are counted, a carry signal MCCRY is output. That is, when all of CA0 to CA2 become 1, the carry signal MCCRY output from the AND gate AN2 becomes 1. In the embodiment shown here, the column counter is a 3-bit counter, but it depends on the capacity of DRAM 2 incorporated in the semiconductor integrated circuit 1. That is, it varies with the number of columns of DRAM 2.

Figure 6A:
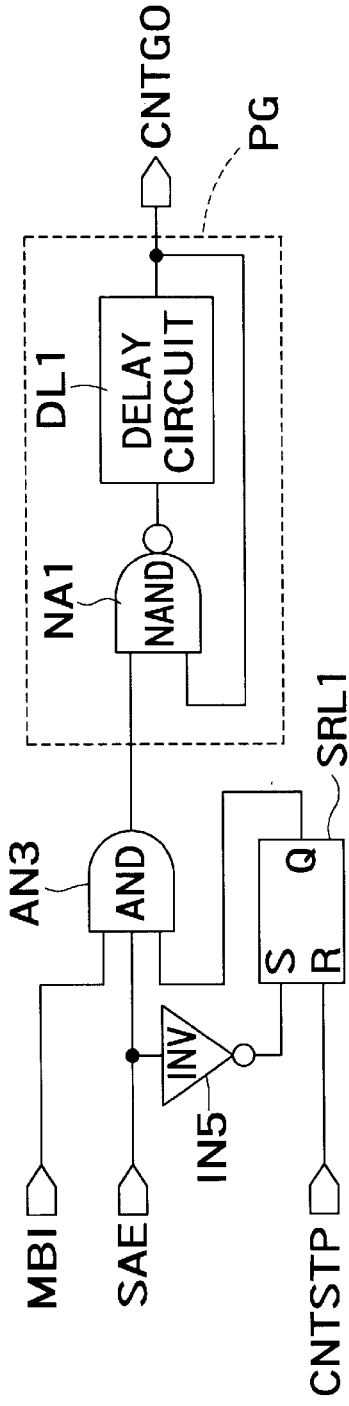
FIGS. 6A and 6B are diagrams showing circuit arrangements in a segment address generating circuit.
Figure 6B:
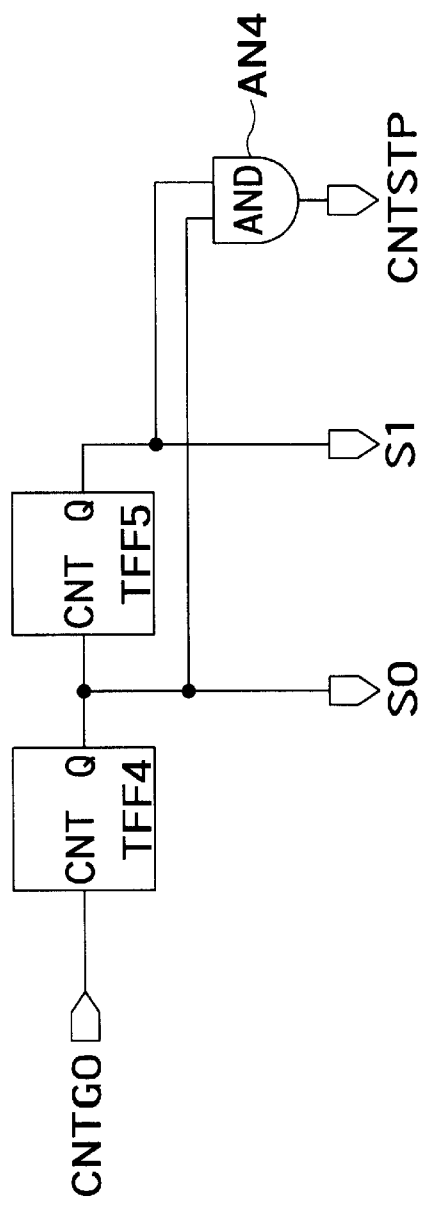

Similarly, FIGS. 6A and 6B show specific circuit arrangements of the segment address generating circuit 43, in which FIG. 6A shows a circuit arrangement of the controller section 43a of the segment address generating circuit 43 whereas FIG. 6B shows a circuit arrangement of a counter section 43b of the segment address generating circuit 43.

As shown in FIG. 6A, the controller section 43A includes an inverter IN5, count execute latch SRL1, AND gate AN3, NAND gate NA1 and delay circuit DL1. The controller section 43A is an example for activating count operation. The count execute latch SRL1 is supplied with a sense amplifier drive signal SAE via the inverter IN5 and a carry signal CNTSTP. The sense amplifier drive signal SAE is output from the sense amplifier control circuit of DRAM 2. The AND gate AN3 is supplied with an output from the count execute latch SRL1, vector create start signal MBI, and sense amplifier drive signal SAE. When all of these three signals are HIGH, a counter activate signal becomes effective. That is, the counter activate signal is output from the AND gate AN3.

The count activate signal is introduced to a pulse generating circuit PG. More specifically, it is input to the NAND gate NA1 provided in the pulse generating circuit PG. The pulse generating circuit PG is made up of the NAND gate NA1 and the delay circuit DL1. The delay circuit DL1 has an arbitrary delay. Therefore, the pulse generating circuit PG is driven by the counter activate signal. The pulse width of the output pulse CNTGO from the pulse generating circuit PG is equal to the delay time, and it is determined by the number of segments activated in one clock cycle of the clock signal CLK. The output pulse CNTGO is introduced into the counter section 43B.

As shown in FIG. 6B, the counter section 43B includes toggle-type flip-flops TFF4, TFF5, and AND gate AN4. The above-mentioned output pulse CNTGO is introduced into the toggle-type flip-flop TFF4, and activates the toggle-type flip-flops TFF4 and TFF5. That is, the toggle-type flip-flops TFF4 and TFF5 execute count operation. The count operation is similar to that of the column address generating circuit 42. In response to the count operation, segment address signals S0 and S1 are output from the toggle-type flip-flops TFF4 and TFF5. When all are counted, a carry signal CNTSTP of the counter is output. That is, when the segment address signals S0 and S1 becomes 1, the carry signal CNTSTP is output. In the embodiment shown here as having four segments, two bits of S0 and S1 are sufficient. The carry signal CNTSTP is introduced into the reset terminal R of the count execute latch SRL1. More specifically, the segment address generating circuit 43 used here starts counting when the sense amplifier drive signal SAE from the sense amplifier control circuit becomes effective, and stops counting when the carry signal CNTSTP is detected.

Figure 7:
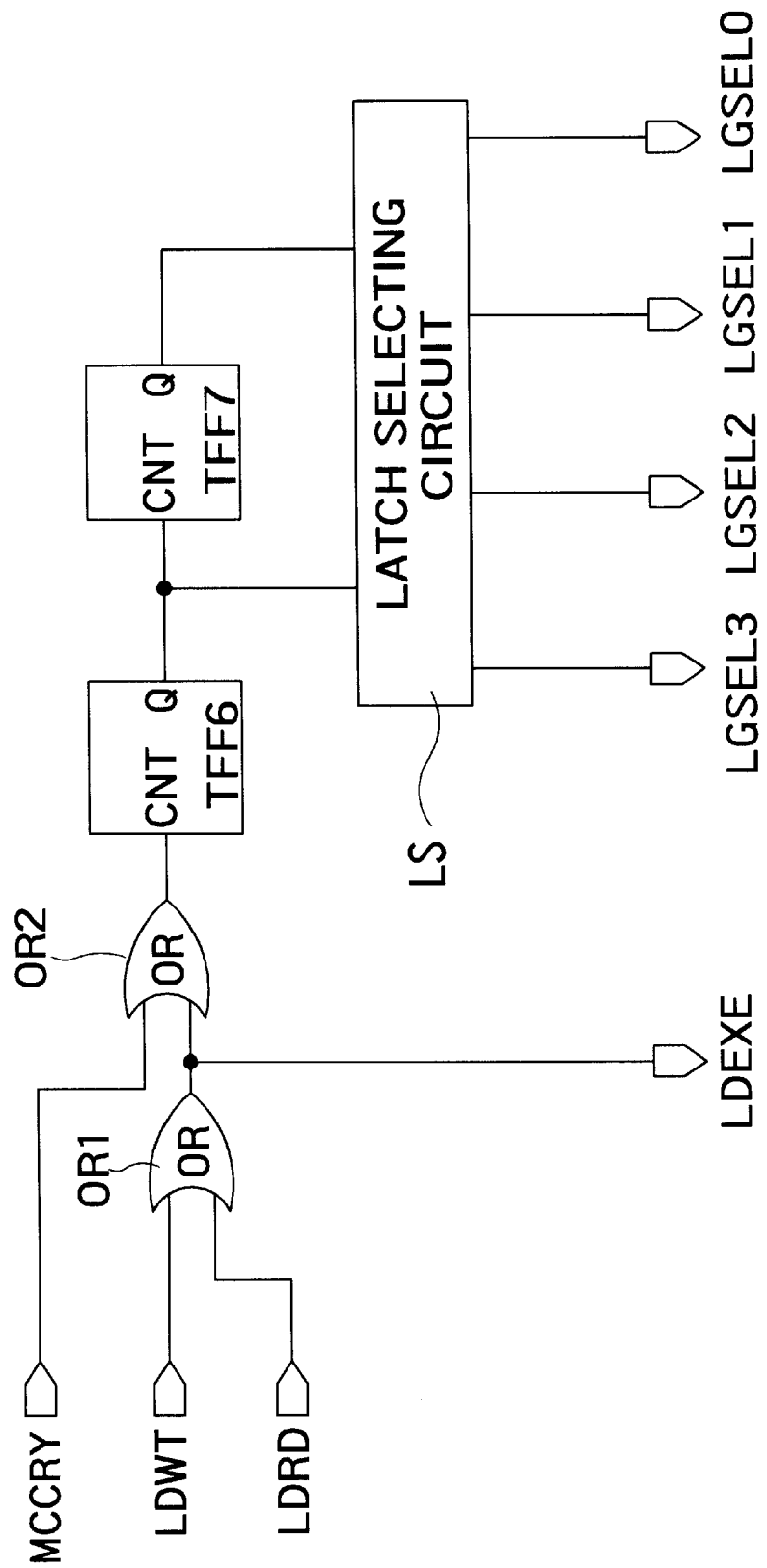
FIG. 7 is a diagram showing a circuit arrangement of a command latch controller in a function command generating circuit.
Figure 8:
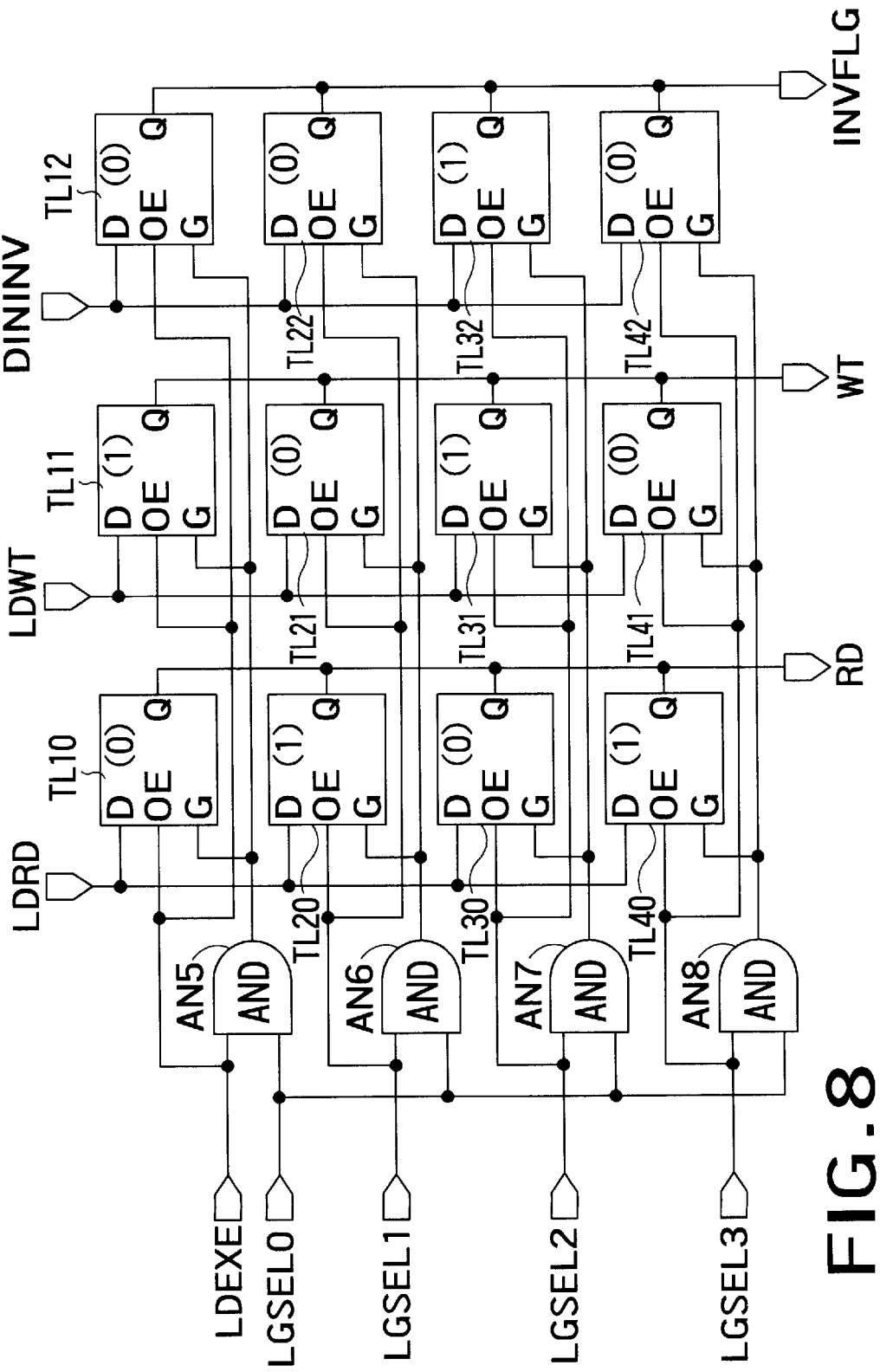
FIG. 8 is a diagram showing a circuit arrangement of a command latch controller in a function command generating circuit.

In FIGS. 7 and 8, concrete circuit arrangements of the function command generating circuit 45 of the vector generating circuit 40 are shown. FIG. 7 shows a the command latch control section 45A of the function command generating circuit 45 whereas FIG. 8 shows the command latch section 45B of the function command generating circuit 45.

As shown in FIG. 7, the command latch control section 45A includes OR gates OR1, OR2, toggle-type flip-flops TFF6, TFF7 and latch selection circuit LS. The OR gate OR1 is supplied with the write signal LDWT and read-out signal LDRD from the logic circuit 3, and releases a drive signal LDEXE. The OR gate OR2 is supplied with the drive signal LDEXE and a carry signal MCCRY. The carry signal MCCRY is a signal from the column address generating circuit 42. Output from the OR gate OR2 is introduced to the toggle-type flip-flop TFF6. The counter made up of the toggle-type flip-flops TFF6 and TFF7 is driven by the output from the OR gate OR2. Output from the toggle-type flip-flops TFF6 and TFF7 is input to the latch selection circuit LS. The latch selection circuit LS is configured to output function selecting signals LGSEL0 to LGSEL3 in response to the counter value. The function selecting signal LGSEL0 to LGSEL3 and the drive signal LDEXE are input to the command latch section 45B shown in FIG. 8.

As shown in FIG. 8, the command latch section 45B includes AND gates AN5 to AN8, and tristate-type transparent latches TL10, 11, 12, TL20, 21, 22 through TL40, 41, 42 in a matrix alignment. The drive signal LDEXE enters into the AND gate AN5 and OE terminals of the transparent latches TL10, 11, 12. The function selecting signal LGSEL0 enters into the AND gates AN5 through AN8. The function selecting signal LGSEL1 enters into the AND gate AN6 and OE terminals of TL20, 21, 22. The function selecting signal LGSEL2 enters into the AND gate AN7 and OE terminals of the transparent latches TL30, 31, 32. The function selecting signal LGSEL3 enters into the AND gate AN8 and transparent latches TL40, 41, 42. Output from the AND gate AN5 enters into G terminals of the transparent latches TL10, 11, 12. Output from the AND gate AN6 enters into G terminals of the transparent latches TL20, 21, 22. Output from the AND gate AN7 enters into G terminals of the transparent latches TL30, 31, 32. Output from the AND gate AN8 enters into G terminals of the transparent latches TL40, 41, 42. The read-out signal LDRD from the logic circuit 3 enters into D terminals of the transparent latches TL10, 20, 30, 40. From Q terminals of the transparent latches 10, 20, 30, 40, the read-out signal RD is released. The write signal LDWT from the logic circuit 3 enters into D terminals of the transparent latches TL11, 21, 31, 41. From Q terminals of these transparent latches TL11, 21, 31, 41, the write signal WT is output. The data invert control signal DININV from the logic circuit 3 enters into D terminals of the transparent latches TL12, 22, 32, 42. From Q terminals of these transparent latches TL12, 22, 32, 42, the data invert control signal INVFLG is output.

In the command latch section 45B, a certain column is selected by the output signal from the latch selection circuit LS. More specifically, in response to the function signals LGSEL0 to LGSEL3, one of columns, namely, transparent latches TL10, 11, 12, transparent latches TL30, 31, 32, or transparent latches TL40, 41, 42 is selected. In the transparent latches TL10 through TL42, an operation program is set previously. That is, the read-out signal LDRD, write signal LDWT and data invert control signal DININV from the logic circuit 3 are supplied previously to the command latch to program the sequence. Therefore, assume, for example, that 0 is programmed in the transparent latch TL10, 1 is programmed in the transparent latch TL11, and 0 is programmed in the transparent latch TL12. Then, the write signal WT is output when the column of the transparent latches 10, 11, 12 is selected. Similarly, assume that 1, 0 and 0 are programmed in the transparent latches TL20, 21 and 22, respectively; 0, 1 and 1 are programmed in the transparent latches 30, 31, 32, respectively; and 1, 0 and 0 are programmed in the transparent latches 40, 41 and 42, respectively. Then, when one of columns of the transparent latches 20, 21, 22 is selected next, the read-out signal RD is output. When one of columns of the transparent latches TL30, 31, 32 is selected next, the write signal WT and the data invert control signal INVFLG are output. When one of columns of the transparent latches TL40, 41, 42 is selected next, the read-out signal RD is output.

It will be understood from FIGS. 7 and 8 that, in the function command generating circuit 45, when the read-out signal LDRD or the write signal LDWT is input from the logic circuit 3, or when the carry signal MCCRY is input from the column address generating circuit 42, LGSEL0 to 3 are selected sequentially.

Although the embodiment has been explained as four read/write commands being programmable, it is possible to design the circuit so that any other number of commands are programmable without being limited to the above example.

Figure 9:
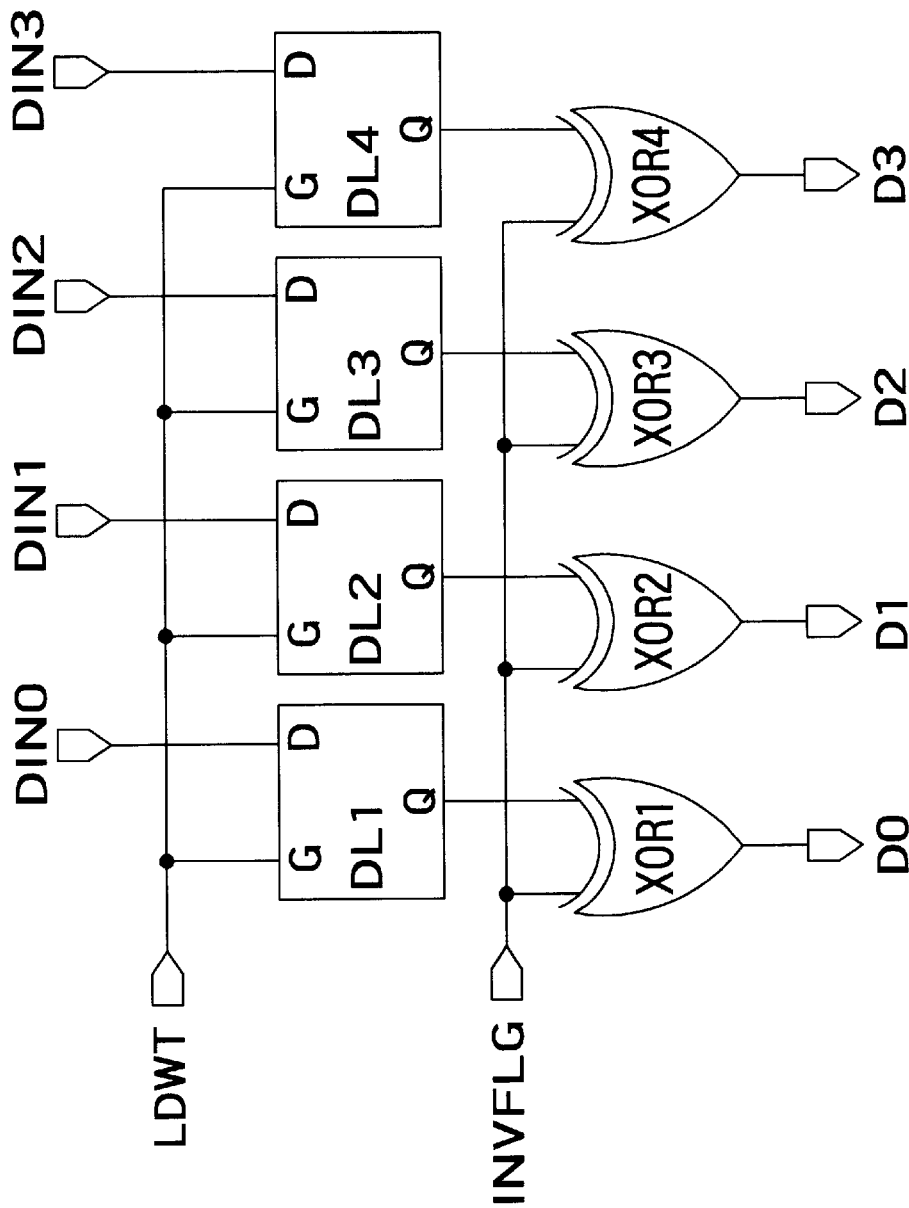
FIG. 9 is a diagram showing a circuit arrangement of a write data generating circuit.

FIG. 9 shows a specific circuit arrangement of the write data generating circuit 44 of the vector generating circuit 40. As shown in FIG. 9, the write data generating circuit 44 includes transparent latches DL1 through DL4, and exclusive OR circuits XOR1 through XOR4. The write signal LDWT from the logic circuit 3 enters into G terminals of the transparent latches DL1 through DL4. The write data initial values DIN0 through DIN3 previously supplied from the logic circuit 3 are input to the transparent latches DL1 through DL4, respectively. That is, the write data initial value DIN0 enters into the D terminal of the transparent latch DL1. The write data initial value DIN1 enters into the D terminal of the transparent latch DL2. The write data initial value DIN2 enters into the D terminal of the transparent latch DL3. The write data initial value DIN3 enters into the D terminal of the transparent latch DL4. Outputs from these transparent latches DL1 through DL4 are introduced to the exclusive OR circuits XOR1 through XOR4. That is, output from the transparent latch DL1 enters into the exclusive OR circuit XOR1. Output from the transparent latch DL2 enters into exclusive OR circuit XOR2. Output from the transparent latch DL3 enters into the exclusive OR circuit XOR3. Output from the transparent latch DL4 enters into the exclusive OR circuit XOR4. These exclusive OR circuits XOR1 through XOR4 also introduce the data invert control signal INVFLG, and release therefrom write data signals D0 to D3. More specifically, exclusive OR circuit XOR1 releases write data signal D0, exclusive OR circuit XOR2 releases write data signal D1, exclusive OR circuit XOR releases write data signal D2, and exclusive OR circuit XOR4 releases write data signal D3.

For these behaviors of the write data generating circuit 44, upon entry of write data initial values DIN0 to 3 previously supplied from the logic circuit 3 and write signal LDWT supplied similarly, initial data upon writing are previously stored in the transparent latches DL1 through DL4. Then, when the data invert control signal INVFLG from the function command generating circuit 45 becomes effective, the write data signals D0 through D3 output to DRAM 2 are inverted by the exclusive OR circuit XOR1 through XOR4. Although the embodiment shown here employs the four-bit data width, any width may be employed provided the transparent latches DL and the exclusive OR circuit XOR make pairs.

Next explained is a burn-in process of the semiconductor integrated circuit. Upon a burn-in process, the operation signal generating circuit made of the vector generating circuit 40 and the refresh counter and control circuit 23 is activated to generate signals necessary for driving DRAM 2. That is, by the operation signal generating circuit formed of the vector generating circuit 40 and the refresh counter and control circuit 23 generates addresses, commands and data only with clock signals supplied from outside. DRAM 2 is activated by these addresses, commands and data, and a stress can be applied to DRAM 2 under a high temperature condition. For example, it is possible to sequentially repeat behaviors, such as writing 1 in all memory cells of DRAM 2, then reading it out, next inverting the data, and next reading it out.

Figure 10:
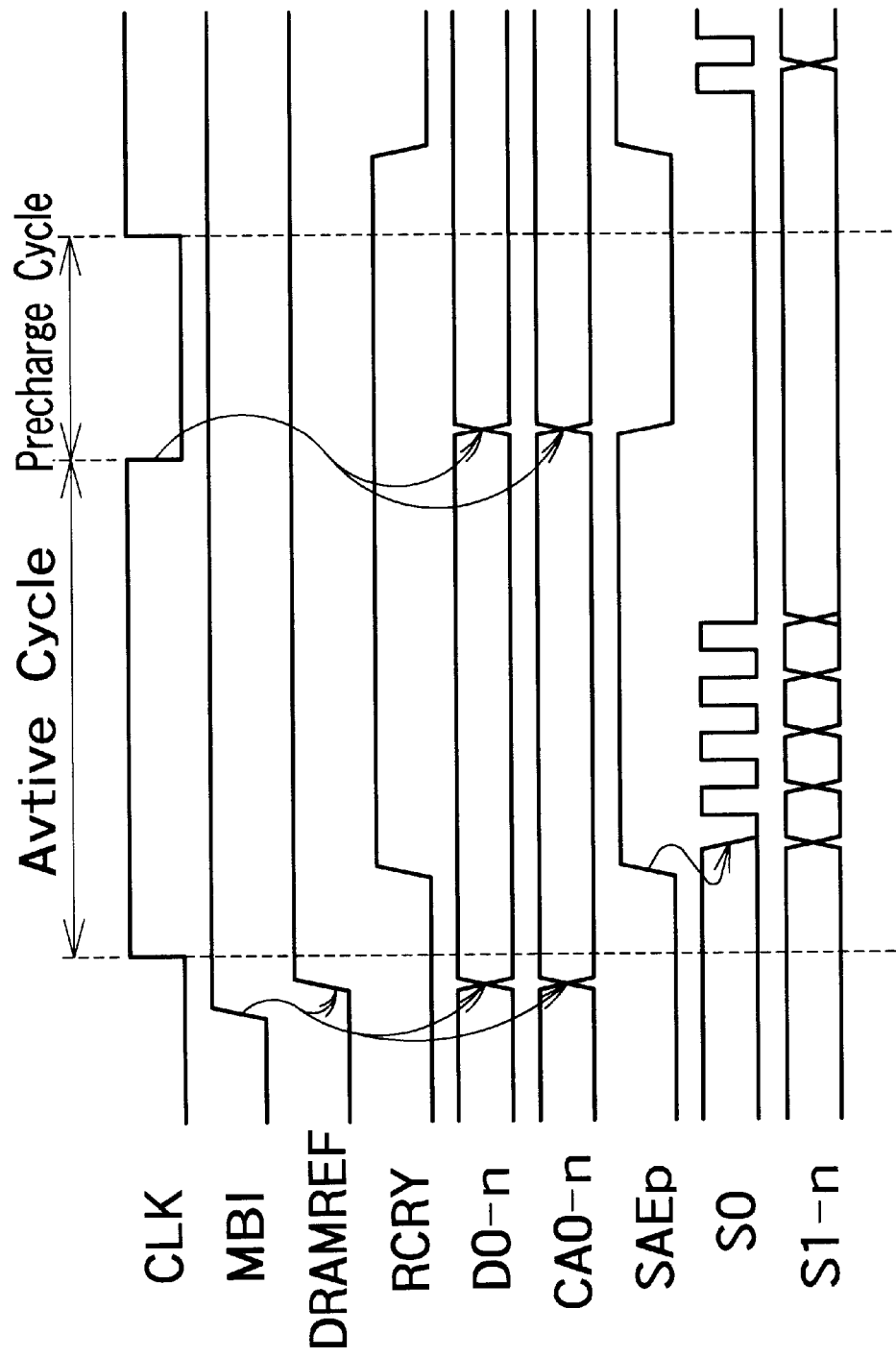
FIG. 10 is a timing chart explaining an exemplary timing of respective circuits.

Next referring to FIG. 10, the timing of operations in the semiconductor integrated circuit during a burn-in process is explained in detail. FIG. 10 is a timing chart of an exemplary timing of operations. As shown in FIG. 10, here is taken a synchronous DRAM which operates in synchronism with the clock signal CLK.

As shown in FIG. 1, the carry signal RCRY is output from the refresh counter and control circuit 23 in DRAM 2. The carry signal RCRY selects row addresses in sequence every time when the clock signal CLK enters from the input circuit 21. As shown in FIG. 10, when selection of all row addresses is completed, the carry signal RCRY changes to level "1" after a predetermined delay time from the rising edge of the clock signal CLK, and returns to level "0" in the next clock cycle. Output from the DRAM 2 is the sense amplifier drive signal SAE as well. The sense amplifier drive signal SAE maintains level "1" during level "1" of the clock signal CLK. Therefore, the sense amplifier drive signal SAE takes level "1" every entry of the clock signal CLK. When the carry signal RCRY is level "1" and the clock signal CLK fall, the toggle-type flip-flops TFF1 to TFF3 forming the counter shown in FIG. 5 are activated. Therefore, apparently from FIG. 10, the column address signal CA0-n changes at the fall of the clock signal CLK. The segment address signal S0-n works in synchronism with the period of level "1" of the sense amplifier drive signal SAE. After the sense amplifier drive signal SAE changes to level "1", the segment address is automatically incremented with a pulse width equal to the delay time of the delay circuit DL1 inside the segment address generating circuit 43 shown in FIG. 6. Therefore, the least significant bit S0 can be used as the inner clock signal. In this manner, when the least significant bit S0 of the segment address signal S0-n, a memory array 27 corresponding to the segment address is selected sequentially in DRAM 2 in synchronization with S0 signal. In the embodiment shown here as having four segments SG1 through SG4, the segment address signal S0 makes four pulses. The vector create start signal MBI is an output from the set/reset-type latch 46 as explained above, and it maintains the status unless it is released. Since the refresh start signal to DRAM 2 is forcibly effectuated whereas the signal in the input circuit 21 from the logic circuit 3 is invalidated, DRAM 2 is controlled only by the vector generating circuit 40 once the vector generating signal MBI becomes effective.

As explained above, in the semiconductor integrated circuit according to the embodiment, DRAM 2 is not influenced by the input signal from the logic circuit 3 as shown in FIG. 1, and can operate independently from the logic circuit. That is, as shown in FIG. 4, when the vector create start signal MBI, which is a latch output signal of the address generating circuit 46, indicates generation of a vector, namely, when MBI=1, the refresh counter provided in DRAM 2 is activated by setting DRAM 2 in the refresh mode. In this case, the counter for refresh operation increment one per each cycle of the clock signal CLK (active cycle plus precharge cycle in FIG. 10). Thereafter, refresh operation is repeated for each row address only by entering the clock signal CLK, and upon completion of refresh operation of all row addresses, the refresh counter and control circuit 23 releases the carry signal RCRY. In response to the carry signal RCRY, the column address generating circuit 42 is activated. The read/write operation is controlled by predetermined signals generated from the function command generating circuit 45. That is, the carry signal MCCRY generated from the column address generating circuit 42 is input to the function command generating circuit 45, and for writing, the write data C0-n from the write data generating circuit 44 is transferred to DRAM 2. By previously storing some commands, such as, 010 for writing, 100 for reading and 01 for inversion, any desired operation combining read and write can be realized.

Therefore, DRAM 2 can execute independent operations not affected from the nput signal from the logic circuit 3. That is, DRAM 2 can be activated only by entering the clock signal CLK from outside.

Additionally, the embodiment has been explained as having four segments SGn (n=1~4) in which a plurality of memory cells are in a matrix alignment. However, even when DRAM 2 includes more or less segments, the read/write time can be equalized for all memory cells. That is, during refresh operation, DRAM 2 can simultaneously activate some memory arrays 27 having any arbitrary capacitance. That is, as shown in FIG. 10, memory arrays 27 in the segments SG1 through SG4 can be selected successively. therefore, even when the number of segments is changed, it merely results in changing the number of segments selected in each clock cycle, and the total time required for the burn-in process need not be changed.

Moreover, as shown in FIG. 4, the semiconductor integrated circuit includes the segment address generating circuit 43 in addition to the column address generating circuit 42. The segment address signal S0-n output from the segment address generating circuit 43 is coupled to a memory array selector like a row decoder (not shown) inside the DRAM 2. The segment address generating circuit 43 is made up of the pulse generating circuit of any desired width shown in FIG. 6A and the counter of any desired bits shown in FIG. 6B, and it is activated by the sense amplifier drive signal SAE output from DRAM 2. As shown in FIG. 2, in refresh operation of DRAM 2, a plurality of activated memory arrays 27 are selectedin sequence. That is, as shown in FIG. 6, read/write operation is done for selected memory arrays in synchronization with the segment address signal S0 generated by the pulse generating circuit PG. In this mode of operation, power consumption can be reduced.

Figure 11:
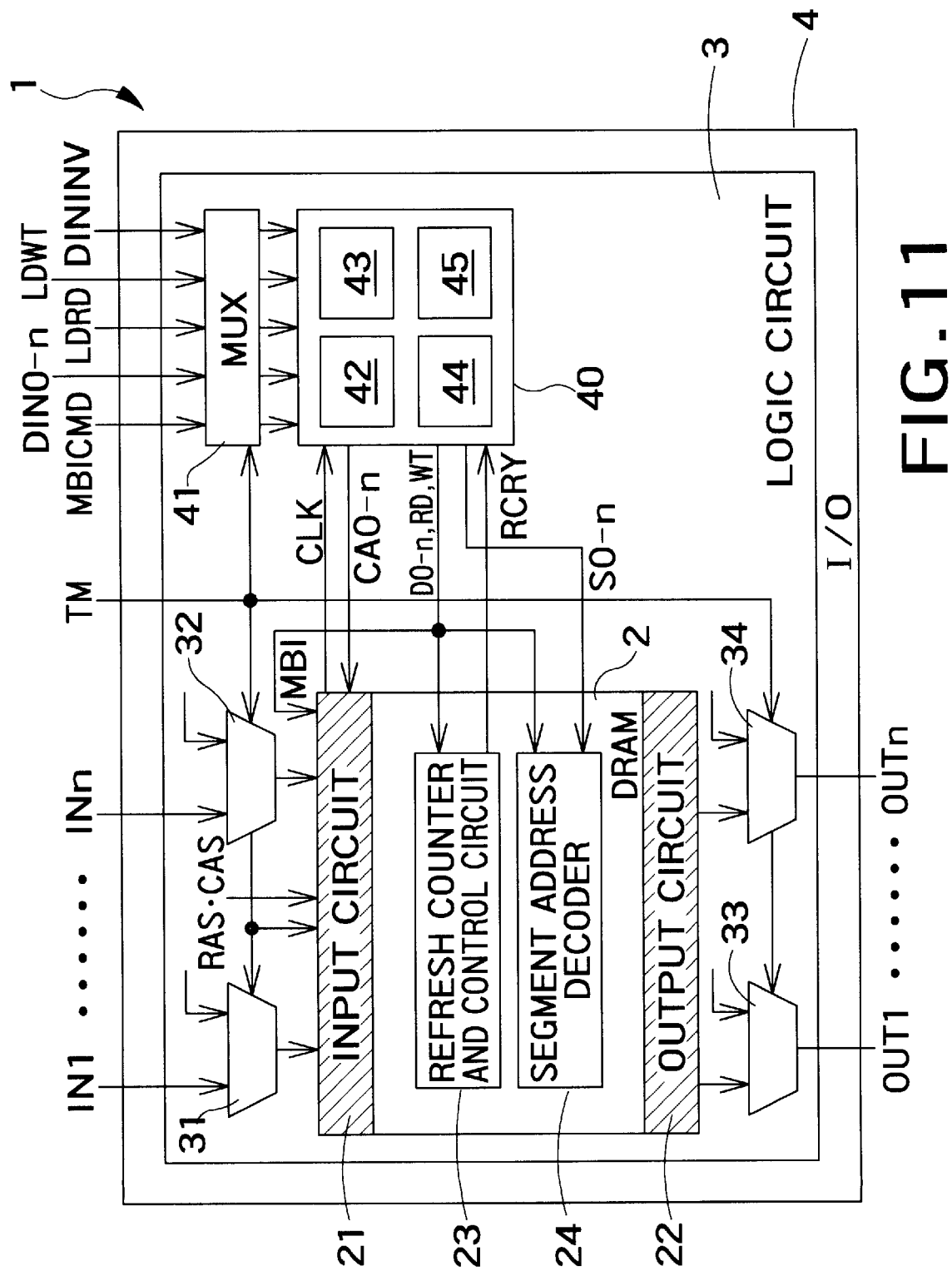
FIG. 11 is a diagram showing another application of the invention.
Figure 12:
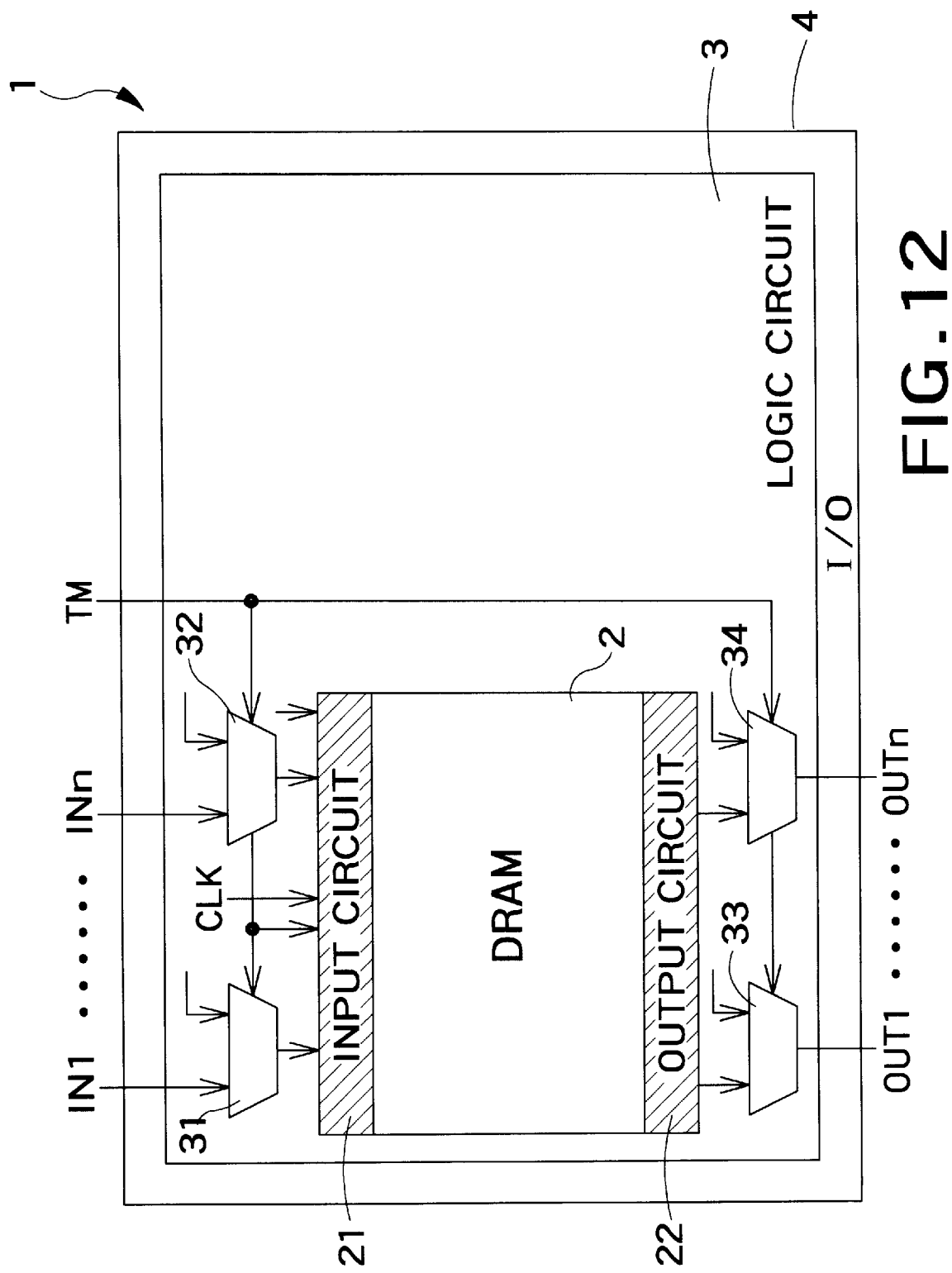
FIG. 12 is a block diagram of a conventional semiconductor integrated circuit.
Figure 13:
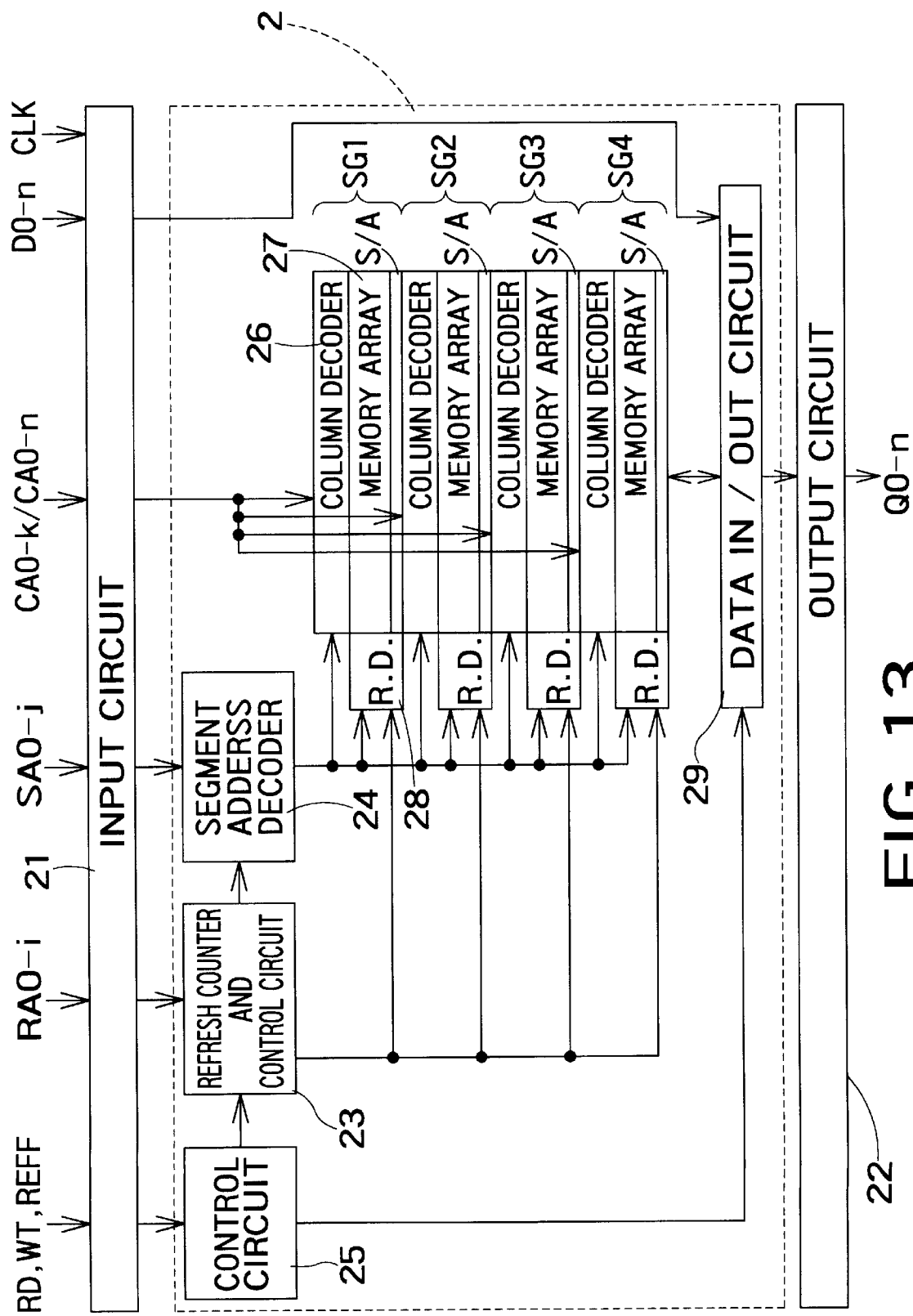
FIG. 13 is a block diagram showing the interior construction of DRAM shown in FIG. 12.

The invention is not limited to the embodiments shown above, but can be changed or modified in various modes. For example, the embodiment shown above has been explained as being a clock-synchronous type; however, the invention is applicable to standard DRAM activated for basic operation by a row address strobe signal RAS and a column address strobe signal CAS as shown in FIG. 11.

The invention is applicable also to DRAM-ASIC. When the invention is employed in DRAM-ASIC, wiring between different memory macros can be simplified by providing the vector generating circuit 40 in each memory macro, and the circuit can easily cope with an increase or decrease of the memory capacitance. That is, by pairing DRAMs 2 with the vector generating circuits 40 in each memory macro by one-to-one, the circuit can be free from constraint on the layout of bus wiring.

As described above, the semiconductor integrated circuit according to the invention makes it possible to apply a stress to DRAM portion and the logic circuit portion by using different vectors for execution of a burn-in process, while realizing read/out patterns equivalent to those of standard DRAM. Moreover, an even stress signal is ensured even upon a change in storage capacity of DRAM liable to occur in a semiconductor integrated circuit incorporating DRAM and a logic circuit.

Although many circuit elements are used for realizing the invention, miniaturizing technologies of semiconductor integrated circuits prevent a large increase of the area as compared with the conventional circuit.

What is claimed is:

1. A semiconductor integrated circuit comprising:
   a memory macro having at least one memory array having an arbitrary storage capacity, a decoder circuit for selecting one of a plurality of memory cells in said memory array, and a sense amplifier for amplifying data from said memory cell;
   an address generating circuit for generating an address specifying each said memory cell;
   a command generating circuit for generating a write or read command for said memory cell; and
   a data generating circuit for generating data to be written in said memory cell.

2. The semiconductor integrated circuit according to claim 1 wherein said memory macro is configured to activate for write or read operation for a plurality of said memory cells only by entering into the memory macro a first control signal as a basic signal for the operation thereof.

3. The semiconductor integrated circuit according to claim 1 wherein said memory macro includes:
   a selecting circuit for selecting signals input to said memory macro from said address generating circuit, said data generating circuit and said command generating circuit and blocking signals input to said memory macro for normal operation thereof when said memory macro is activated for an operation test, said selecting circuit being switched by a mode selection signal introduced from outside to determine which signals be selected or blocked.

4. The semiconductor integrated circuit according to claim 1 wherein said address generating circuit includes:
   a row address generating circuit for sequentially generating row addresses; and
   a column address generating circuit for generating a next column address after every full cycle of said row addresses.

5. The semiconductor integrated circuit according to claim 1 wherein said address generating circuit includes:
   a column address generating circuit for sequentially generating column addresses; and
   a row address generating circuit for generating a next row address after every full cycle of said column addresses.

6. A semiconductor integrated circuit comprising:
   a memory macro having at least one memory array having an arbitrary storage capacity, a decoder circuit for selecting one of a plurality of memory cells in said memory array, and a sense amplifier for amplifying data from said memory cells;
   an address generating circuit for generating an address specifying each said memory cell;
   a command generating circuit for generating a write or read command for said memory cell; and
   a data generating circuit for generating data to be written in said memory cell, wherein said address generating circuit includes:
   a row address generating circuit for generating a row address;
   a column address generating circuit for generating a column address; and
   a segment address generating circuit for generating a segment address.

7. The semiconductor integrated circuit according to claim 6 wherein said segment address generating circuit is configured to start operation thereof subject to entry of a signal indicating the start of an operation test of said memory.

8. The semiconductor integrated circuit according to claim 7 wherein said signal indicating the start of an operation test of said memory macro is introduced into an address create control circuit having the function of holding said signal, and said segment address generating circuit starts operation thereof subject to entry of said signal from said address create control circuit.

9. The semiconductor integrated circuit according to claim 6 wherein segment address signals generated from said segment address generating circuit make a full turn in one cycle of a first control signal as the basic signal of operation introduced into said memory macro.

10. The semiconductor integrated circuit according to claim 6 wherein said segment address generating circuit includes:

a counter circuit with a plurality of bits the least significant bit of which is used as a second control signal to select memory arrays sequentially in synchronization with said second control signal.

11. The semiconductor integrated circuit according to claim 10 wherein said segment address generating circuit starts operation thereof in response to a sense amplifier drive signal generated by said memory macro and stops said operation in response to a stop signal output from said counter circuit within said segment address generating circuit.

12. The semiconductor integrated circuit according to claim 11 wherein said memory macro includes:

a segment address decoder supplied with a segment address signal generated by said segment address generating circuit to effectuate said segment address signal from said segment address generating circuit upon receipt of a signal indicating the start of an operation test of said memory macro and to invalidate said segment address signal otherwise.

13. The semiconductor integrated circuit according to claim 6 wherein said command generating circuit stores a write command, a read command and a data invert command to select one of these commands upon every full turn of column addresses generated by said column address generating circuit.

14. The semiconductor integrated circuit according to claim 6 wherein said data generating circuit includes:

a latch circuit for storing initial data; and a data inverting circuit for outputting said data stored in said latch circuit after inverting it, said data inverting circuit being activated for inverting operation thereof by a signal output from said command generating circuit.

15. A semiconductor integrated circuit incorporating memory and a logic circuit, comprising:

a mode switching circuit for switching a normal mode for normally accessing to said memory and a test mode for executing an operation test of said memory therebetween; and an operation signal generating circuit for generating a signal necessary for activating said memory and to activate said memory simultaneously with operation of said logic circuit by an input from outside of said logic circuit in said test mode.

16. The semiconductor integrated circuit according to claim 15 wherein said operation signal generating circuit includes:

an address generating circuit for generating a signal required to specify an address in said memory;

a data generating circuit for generating data to be written in said memory; and a function command generating circuit for generating a command to said memory.

17. The semiconductor integrated circuit according to claim 16 said memory is of a dynamic type, and said address generating circuit includes:

a column address generating circuit located outside of said memory to generate a column address in the address in said memory; and a refresh counter located inside said memory to generate a row address required for refresh operation of said memory in said normal mode and to generate a row address in said memory in said test mode.

18. The semiconductor integrated circuit according to claim 16 wherein said address generating circuit includes:

a column address generating circuit located outside said memory to generate a column address in said memory; and a row address generating circuit located outside said memory to generate a row address in said memory.

19. The semiconductor integrated circuit according to claim 16 wherein said memory includes a plurality of segments, and said address generating circuit includes a segment address generating circuit for selecting one of said segments in response to a signal from said segment address generating circuit so as to select all of said segments in one cycle of a first control signal which is a basis signal of operation thereof introduced into said memory from outside.

* * * * *